(12) United States Patent
Anderson et al.

(10) Patent No.: US 7,519,827 B2
(45) Date of Patent: Apr. 14, 2009

(54) PROVISIONING AND USE OF SECURITY TOKENS TO ENABLE AUTOMATED TEST EQUIPMENT

(75) Inventors: Roy E. Anderson, Fort Collins, CO (US); Horst Perner, Boeblingen (DE); Eric Furmanek, Herrenberg-Haslach (DE)

(73) Assignee: Verigy (Singapore) Pte. Ltd., Singapore (SG)

( * ) Notice: Subject to any disclaimer, the term of this patent is extended or adjusted under 35 U.S.C. 154(b) by 872 days.

(21) Appl. No.: 10/819,755

(22) Filed: Apr. 6, 2004

(65) Prior Publication Data

US 2005/0223232 A1 Oct. 6, 2005

(51) Int. Cl.
*H04K 1/00* (2006.01)

(52) U.S. Cl. .................. 713/184; 713/186; 713/151; 713/165; 713/156; 713/1; 726/26; 726/20; 726/12; 726/6; 380/286

(58) Field of Classification Search .................. 713/184
See application file for complete search history.

(56) References Cited

U.S. PATENT DOCUMENTS

| | | | | | |
|---|---|---|---|---|---|
| 4,910,775 | A | * | 3/1990 | Yves et al. ................ | 713/184 |
| 4,970,466 | A | * | 11/1990 | Bolles et al. .............. | 324/533 |
| 5,280,527 | A | * | 1/1994 | Gullman et al. ........... | 713/184 |
| 6,239,796 | B1 | * | 5/2001 | Alexander ................. | 715/809 |
| 6,442,692 | B1 | * | 8/2002 | Zilberman ................. | 713/184 |
| 6,512,988 | B1 | * | 1/2003 | Kanago ..................... | 702/123 |
| 6,560,663 | B1 | * | 5/2003 | Logsdon et al. ........... | 710/113 |
| 6,587,543 | B1 | * | 7/2003 | Howard et al. ........... | 379/10.01 |
| 6,704,873 | B1 | * | 3/2004 | Underwood ............... | 726/12 |
| 7,031,860 | B2 | * | 4/2006 | Liang et al. ............... | 702/84 |
| 7,047,442 | B2 | * | 5/2006 | Sutton ...................... | 714/25 |
| 7,073,109 | B2 | * | 7/2006 | Kolman .................... | 714/724 |
| 7,079,555 | B2 | * | 7/2006 | Baydar et al. ............. | 370/532 |
| 7,302,258 | B1 | * | 11/2007 | Sylvain .................... | 455/432.1 |
| 2001/0052077 | A1 | * | 12/2001 | Fung et al. ................ | 713/184 |
| 2002/0029341 | A1 | * | 3/2002 | Juels et al. ................ | 713/184 |
| 2003/0167427 | A1 | * | 9/2003 | Kraus et al. ............... | 714/718 |
| 2003/0208697 | A1 | * | 11/2003 | Gardner .................... | 713/202 |
| 2003/0212895 | A1 | * | 11/2003 | Kisliakov ................. | 713/185 |
| 2004/0267487 | A1 | * | 12/2004 | Brown et al. ............. | 702/120 |
| 2004/0268199 | A1 | * | 12/2004 | Phelps et al. ............. | 714/742 |
| 2007/0168808 | A1 | * | 7/2007 | Ong ......................... | 714/731 |

OTHER PUBLICATIONS http://elib.uni-stuttgart.de/opus/volltexte/2002/1176/pdf/DIP-1987.pdf.*

* cited by examiner

*Primary Examiner*—Ellen Tran
*Assistant Examiner*—Yonas Bayou
(74) *Attorney, Agent, or Firm*—Holland & Hart, LLP

(57) ABSTRACT

Automated test equipment (ATE) is provided with a plurality of hardware components, at least two of which provide a common test feature. The ATE is also provided with program code to access a number of security tokens, each token of which grants rights to use one or more test features without specifying a particular hardware component on which the test features are to be enabled. If a number of security tokens granting rights to use the common test feature are available, the program code enables the common test feature on user-selected ones of the hardware components that provide the common test feature, as permitted by the number of security tokens. Methods for provisioning and using the security tokens to enable the ATE are also disclosed.

22 Claims, 7 Drawing Sheets

```
INCREMENT  0-to-100MHZ  socbu  4.3  10-July-2004  64 \
VENDOR_STRING="75E5901660020701"  SIGN="05924113F65A
```

| Part Number | Description | Reference Price |
|---|---|---|
| E1010A | Digital I/O Channel Card (no enabled features) | $ X |
| E6900A | | (Info Heading) |
| E6900A/Opt 100 | Speed: 0-to-100MHZ Permanent | $ Y |
| E6900A/Opt 110 | Speed: 0-to-100MHZ 5-years | $ Y * 86% |
| E6900A/Opt 120 | Speed: 0-to-100MHZ 3-years | $ Y * 64% |
| E6900A/Opt 130 | Speed: 0-to-100MHZ 1-year | $ Y * 29% |
| E6900A/Opt 140 | Speed: 0-to-100MHZ 6-months | $ Y * 17% |
| E6900A/Opt 150 | Speed: 0-to-100MHZ 3-months | $ Y * 10% |
| E6900A/Opt 160 | Speed: 0-to-100MHZ 30-days | $ Y * 4% |
| E6910A | Speed: 100-to-200MHZ Group | (Info Heading) |
| E6910A/Opt 100 | Speed: 100-to-200MHZ Permanent | $ Z |
| E6910A/Opt 110 | Speed: 100-to-200MHZ 5-years | $ Z * 86% |
| E6910A/Opt 120 | Speed: 100-to-200MHZ 3-years | $ Z * 64% |
| E6910A/Opt 130 | Speed: 100-to-200MHZ 1-year | $ Z * 29% |
| E6910A/Opt 140 | Speed: 100-to-200MHZ 6-months | $ Z * 17% |
| E6910A/Opt 150 | Speed: 100-to-200MHZ 3-months | $ Z * 10% |
| E6910A/Opt 160 | Speed: 100-to-200MHZ 30-days | $ Z * 4% |

FIG. 7

```
SERVER mickey 00306E30
VENDOR socbu
INCREMENT 0-to-7MV       socbu  4.3  permanent   64  VENDOR_STRONG="75E5901660020701"
INCREMENT 7-to-14MV      socbu  4.3  permanent   64  VENDOR_STRONG="75E5901660020701"
INCREMENT 14-to-28MV     socbu  4.3  permanent   64  VENDOR_STRONG="75E5901660020701"
INCREMENT 28-to-54MV     socbu  4.3  1-May-2004  32  VENDOR_STRONG="75E5901660020701"

INCREMENT 0-to-100MHZ    socbu  4.3  permanent   64  VENDOR_STRONG="75E5901660020701"
INCREMENT 100-to-200MHZ  socbu  4.3  permanent   64  VENDOR_STRONG="75E5901660020701"
INCREMENT 200-to-300MHZ  socbu  4.3  permanent   64  VENDOR_STRONG="75E5901660020701"
INCREMENT 300-to-400MHZ  socbu  4.3  1-May-2004  32  VENDOR_STRONG="75E5901660020701"

# additional scalable feature statements
```

PROVISIONING AND USE OF SECURITY TOKENS TO ENABLE AUTOMATED TEST EQUIPMENT

BACKGROUND OF THE INVENTION

Automated test equipment (ATE) is often capable of assuming a variety of configurations. Some configurations are obtainable by means of upgrades (e.g., the insertion of new feature cards or memory modules). Other configurations are obtainable by means of feature enablement. Regardless of how ATE is upgraded, a security system may be implemented to control which features of the ATE system may be used. Existing security systems typically enable ATE test features by means of specific chips, programmed chips (e.g., EEPROMs), or codes that are tied to particular hardware components of the ATE system.

SUMMARY OF THE INVENTION

One aspect of the invention is embodied in automated test equipment (ATE) comprising a plurality of hardware components, at least two of which provide a common test feature. The ATE further comprises program code to access a number of security tokens, each token of which grants rights to use one or more test features without specifying a particular hardware component on which the test features are to be enabled. If a number of security tokens granting rights to use the common test feature are available, the program code enables the common test feature on user-selected ones of the hardware components that provide the common test feature, as permitted by the number of security tokens.

Another embodiment of the invention is embodied in a computer-based method for operating ATE. The method commences with the loading of a test program for a device under test. The features of the ATE that are necessary to execute the test program, and the availability of security tokens needed to enable the features of the ATE that are necessary to execute the test program, are then determined. If there are not enough available security tokens to execute the test program, a user is prompted with options for obtaining the required security tokens. Also, the security tokens needed to execute the test program are checked out to the ATE that will execute the test program.

Yet another aspect of the invention is embodied in a method for providing ATE to a user. To begin, a number of hardware components are provided to the user, at a cost that values a base and potential value of the hardware components. The potential value of a hardware component values potential test features of the hardware component (which potential test features are not usable by the user absent their activation via a security token). Along with the number of hardware components, the user is provided program code that enables the user to activate the potential test features. A number of security tokens are then offered to the user. Each security token is 1) consumable the program code to enable at least one of the potential test features, but 2) does not specify any particular one of the user's hardware components on which the potential test features are to be enabled. In response to a request by the user, requested ones of the security tokens are provided to the user, at costs that value the potential test features enabled by the security tokens.

Other embodiments of the invention are also disclosed.

BRIEF DESCRIPTION OF THE DRAWINGS

Illustrative and presently preferred embodiments of the invention are illustrated in the drawings, in which:

FIG. 7 illustrates part of an exemplary price list 700 for ordering ATE;

FIG. 8 provides an exemplary view of the contents of an ASCII text file containing a number of security tokens.

DESCRIPTION OF THE PREFERRED EMBODIMENT

Figure 1:
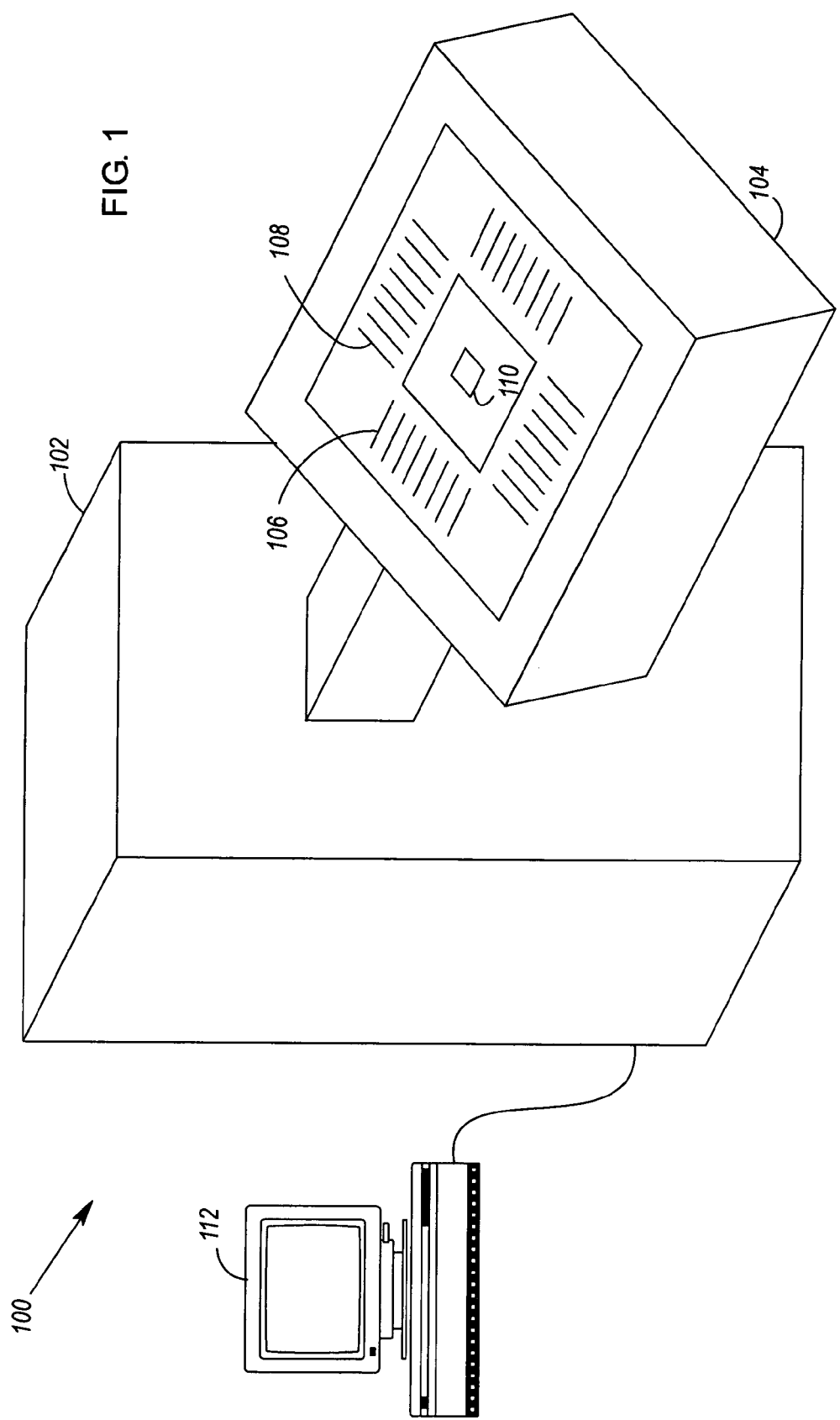
FIG. 1 illustrates an exemplary piece of automated test equipment (ATE)
Figure 2:
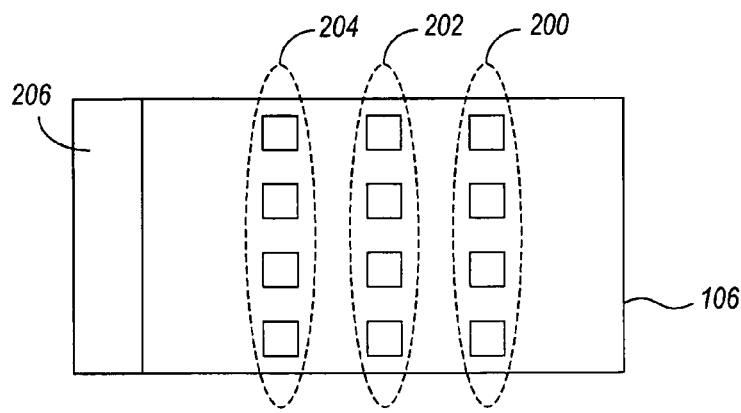
FIG. 2 illustrates an exemplary channel card of the ATE shown in FIG. 1.

FIG. 1 illustrates an exemplary piece of automated test equipment (ATE 100). As shown, the ATE 100 may comprise a plurality of hardware components, such as a main unit 102, a test head 104, channel cards 106, 108, processors, memory, and I/O pins (i.e., pins for interfacing with a device under test (DUT 110)). As shown in FIG. 2, at least some of the hardware components (e.g., processors 200, memory 202, 204, and I/O pins 206) may reside on ones of the ATE's channel cards 106. By way of example, some or all of the components 102-108, 200-206 may be embodied in a 93000 system-on-a-chip (SOC) Tester (distributed by Agilent Technologies, Inc. of Palo Alto, Calif., USA).

In one embodiment of the ATE 100, at least two of its hardware components (e.g., channel cards 106 & 108) provide a common test feature. During execution of program code associated with the ATE 100, the code accesses a number of security tokens, each token of which grants rights to use one or more test features, without specifying a particular hardware component on which the test features are to be enabled. If a number of security tokens granting rights to use the common test feature are available, the code enables the common test feature on user-selected ones of the hardware components that provide the common test feature, as permitted by the type and number of security tokens available.

Unlike past ATE security systems, wherein specific test features are only enabled by means of specific chips, programmed chips (e.g., EEPROMs), or codes that are tied to a particular hardware component of the ATE, the ATE described above breaks the structured ties between test features and the means for enabling them. Although this break is useful in enabling all sorts of test features, it is especially useful to manufacturers that would like to provide (or users that would like to enable) "scalable" test features. A scalable test feature may variously comprise, for example, a test feature that not all customers purchasing a given ATE component will want to use, or a test feature that a customer may only need to use at certain times or for certain tests, or a test feature that may be enabled for each of a number of I/O pins (but not necessarily for all pins at once, or not necessarily for the same pins during different tests). Examples of scalable test features include test speed, storage for test vectors, storage for test waveforms, and storage for test drive edges.

As defined herein, ATE 100 may take the form of a single automated tester 102, 104 that has program code stored thereon. ATE 100 may also take the form of an automated tester 102, 104 that is controlled by a separate computer system 112 (e.g., a personal computer or security token server), as shown in FIG. 1. Alternately, ATE may comprise a plurality of automated testers 300, 302, 304 that are controlled by one or more networked computer systems 306. See FIG. 3. In some cases, each automated tester 300-304 may be associated with its own computer system (as shown in FIG. 1), with each of these computer systems then being controlled by a central computer system 306. Also note that the automated testers 300-304 shown in FIG. 3 need not be in one physical location (designated by line 308). ATE may also take other forms.

Figure 3:
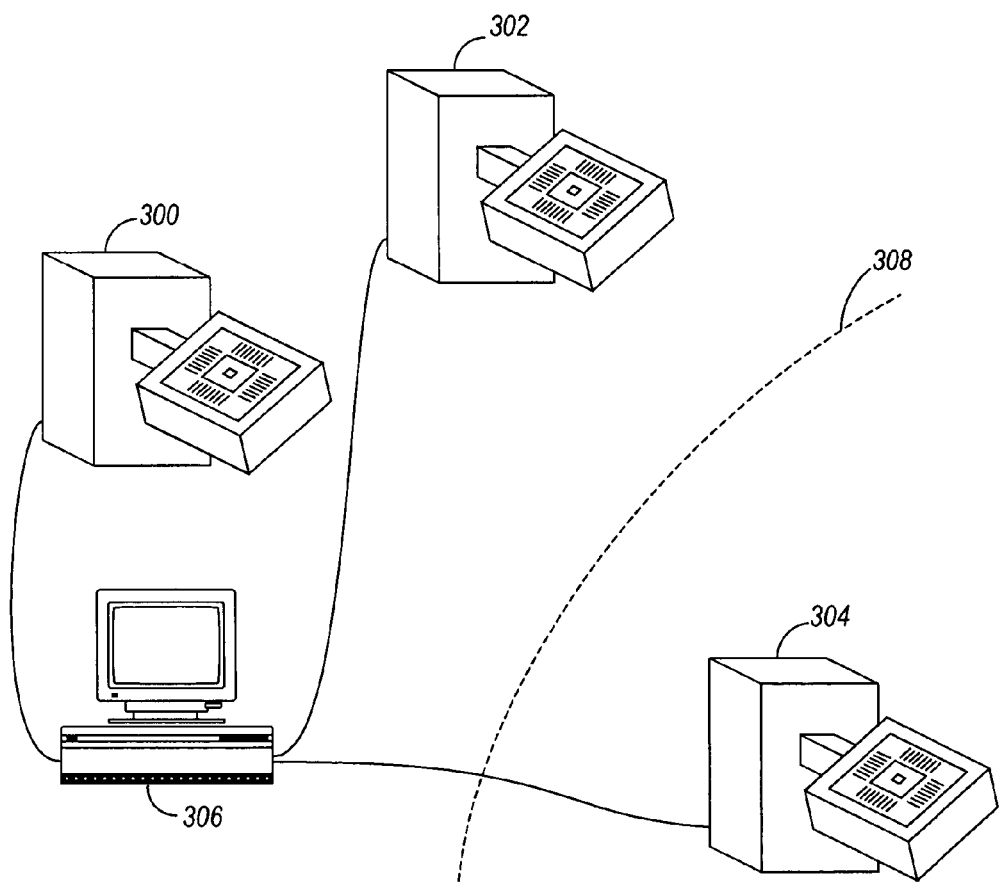
FIG. 3 illustrates an exemplary plurality of automated testers, controlled by a computer system over a network.

If ATE is configured as shown in FIG. 3, the plurality of hardware components that provide the common test feature may be distributed among various ones of the automated testers 300-304. Furthermore, the program code that accesses security tokens to enable the test feature may be distributed among various ones of the automated testers 300-304, as well as one or more personal computers or security token servers 306. Preferably, however, the security tokens are maintained by the personal computer(s) or security token server(s) 306 so that they may be easily accessed by any of the automated testers 300-304. In fact, even when ATE takes the form of only a single automated tester 102, 104, it may be desirable to maintain security tokens on a personal computer or security token server 112 that is distinct from the automated tester 102, 104 (e.g., to enable backup of the tokens). In one embodiment, security tokens are "locked" to one particular computer or network.

When program code relies on a security token to enable a test feature, the program code may "check out" the security token, thereby changing the status of the relied on security token to "unavailable". However, if a security token specifies a number of instances of a feature that may be enabled, and if all of those instances are not currently enabled, the security token may only be partially checked out (e.g., with a notation of the security token's used and unused rights). Alternately, the security token may be checked out multiple times, up to the number of test feature instances it is allowed to enable; or, a policy may be instituted wherein unused instances of the test features that a security token if capable of enabling are forfeited.

Although a system is envisioned wherein security tokens are only used once (or permanently checked out), a system is also envisioned wherein security tokens are allowed to "float". That is, a security token may be checked out to enable a given test feature. However, when it is determined that the given test feature no longer needs to be enabled, program code provides a mechanism wherein the security token that enables the test feature may be checked back in, thereby disabling the formerly enabled test feature and returning the status of the security token to "available". Security tokens may therefore float from feature to feature as specified by their user (that is, within the confines of the types and numbers of feature(s) that the security tokens are allowed to enable).

Following are a number of examples demonstrating how security tokens may be used. In one embodiment, a security token might grant a user the right to enable one or more test features (e.g., a test speed of 400 MHz) on a particular channel card of an automated tester. If the user owns eight channel cards, the user might choose to use the security token to enable a higher test speed on any one of the channel cards. In a slight variation of this embodiment, the security token might grant the user rights to use one or more test features on a particular number of hardware components (e.g., the security token might grant rights to test at a speed of 400 MHz on four channel cards). If a security token grants rights that may be associated with multiple components, a means may be provided to securely track a mix of available and unavailable rights that are associated with the security token. Alternately, to avoid having to track available and unavailable rights, program code might force a user to "use or lose" all of the rights that are associated with a security token (i.e., forfeit unused rights). However, if security tokens are of the floating type, a release of rights that are currently being used could also result in the release of formerly forfeited rights.

In a second embodiment, a security token might grant rights to use one or more test features on a number of I/O pins for testing a device under test, without specifying on which or how many hardware components the pins can reside. Thus, if an automated tester is configured with eight channel cards, each of which has thirty-two I/O pins, and if a security token grants rights to use thirty-two I/O pins, the security token could be used to fully enable the I/O pins of a single channel card or, for example, four I/O pins on each of the channel cards.

Figures 4, 5:
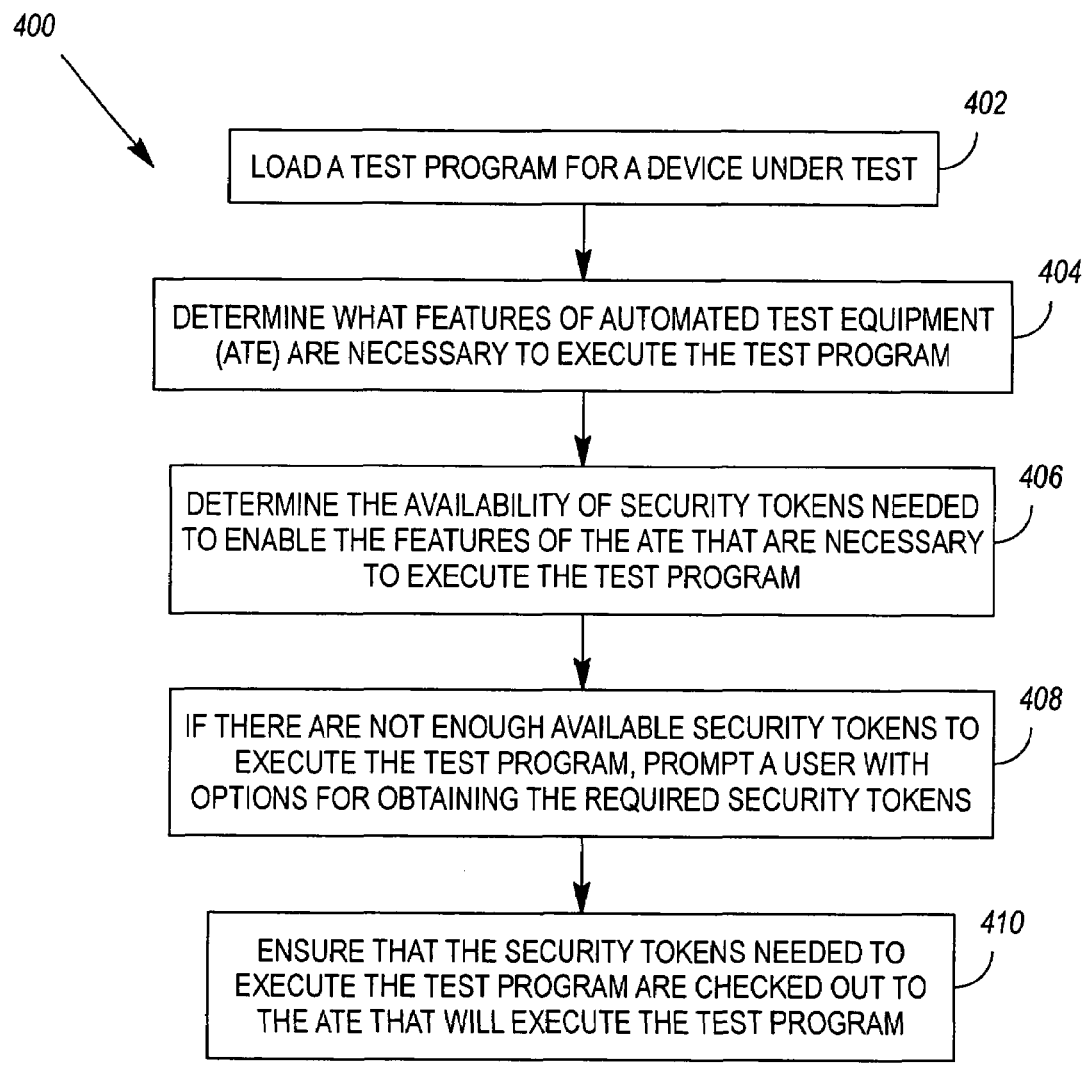
FIG. 4 illustrates a computer-based method for operating ATE such as that which is disclosed in any of FIGS. 1-3.
FIG. 5 illustrates an exemplary security token, embodied in a FLEX/m™ license line.

FIG. 4 illustrates a computer-based method 400 for operating ATE such as that which is disclosed in FIGS. 1-3. The method 400 commences with the loading 402 of a test program for a device under test. Those features of the ATE that are necessary to execute the test program, as well as the availability of the security tokens needed to enable the features of the ATE, are then determined 404, 406. If there are not enough available security tokens, a user is prompted 408 with options for obtaining the required security tokens. The method 400 then ensures that the security tokens needed to execute the test program are checked out 410 to the ATE that will execute the test program. Optionally, the method may comprise releasing the security tokens after the test program has been executed.

One exemplary option for obtaining the required security tokens comprises causing ATE that will not execute the test program to relinquish one or more security tokens that it has checked out. Another option for obtaining the required security tokens is to purchase the required security tokens (for example, over the Internet). Another option for obtaining the required security tokens comprises triggering an "overuse policy".

An overuse policy is a policy that specifies certain types or certain numbers of security tokens that may be relied on prior to their purchase by a user. That is, an overuse policy allows a user to "pay after use" rather than "pay before use". However, given that some security tokens may be more valuable than others, and given that a fully enabled system of ATE may be well beyond the credit limit of a particular customer, an overuse policy can be configured to limit the types or numbers of security tokens on which a user may rely.

One exemplary way to implement the above methods and apparatus is via the FLEX/m™ license management engine. FLEX/m™ is a product of Macrovision Corporation of Santa Clara, Calif., USA. Using FLEX/m™, security tokens may be implemented as FLEX/m™ "license lines", which are encrypted text strings. A collection of security tokens may be stored together as a FLEX/m™ license file (*.lic). Such a license file may also contain FLEX/m™ directives and comments.

An exemplary security token, embodied in a FLEX/m™ license line, may appear as shown in FIG. 5. The exemplary security token begins with a keyword (e.g., INCREMENT), followed by an indication of the test feature it enables (e.g., a test speed of 0-to-100 MHZ). This is followed by a vendor designation (e.g., socbu) and a version number (e.g., 4.3). The expiration date indicates when the security token will expire (e.g., 10 Jul. 2004). Alternately, the expiration date may be open-ended (e.g., permanent). If a security token has expired, the FLEX/m™ software will not rely on it. The expiration date may be followed by a count (e.g., 64), which can be useful in compacting like security tokens into a single license line. Finally, the license line comprises a customer order number (e.g., VENDOR_STRING="75E5901660020701") and a digital signature (e.g., SIGN="05924113F65A"). The customer number may serve as a unique identifier of a security token. The digital signature ensures that the security token can only be used by the security server to which it is sent.

The FLEX/m™ license file (containing a number of security tokens) may be locked to a computer via a unique, unalterable security ID. By way of example, the security ID may variously be the computer's host ID, the computer's Ethernet address, or a computer's or instrument's serial number. The computer, or "security server", to which the license file is locked may provide its security server functions by running the FLEX/m™ license server software.

Once a license file is locked to a particular security server, the security tokens within the license file may then be checked out by various ATE components that are networked with the security server. Note that the FLEX/m™ security token shown in FIG. 5 is hardware non-specific, meaning that it may be checked out by any hardware component for which the security token makes sense. Once a security token is checked out, it may later be checked back in and then checked out to a different ATE component. Security tokens used in this manner are therefore akin to FLEX/m™ "floating" licenses, and may be treated as such.

Note that security tokens may be "additive". That is, a plurality of security tokens may be needed to enable a given test feature. Consider, for example, a desired test speed of 400 MHz. If security tokens are offered for test speeds of 0-to-100 MHz, 100-to-200 MHz, and 200-to-400 MHz, then one of each of these security tokens would be needed to enable a test speed of 400 MHz. Alternately, a security token might also be provided for 0-to-400 MHz. However, if a user has already purchased 0-to-100 MHz and 100-to-200 MHz tokens, the user might be less motivated to purchase a 0-to-400 MHz token (and may even become disgruntled for having to do so). In most cases, it is desirable to keep the granularity of security tokens small enough to 1) provide convenience to their user, and 2) encourage their user to readily purchase additional security tokens as the user's needs increase.

Figure 6:
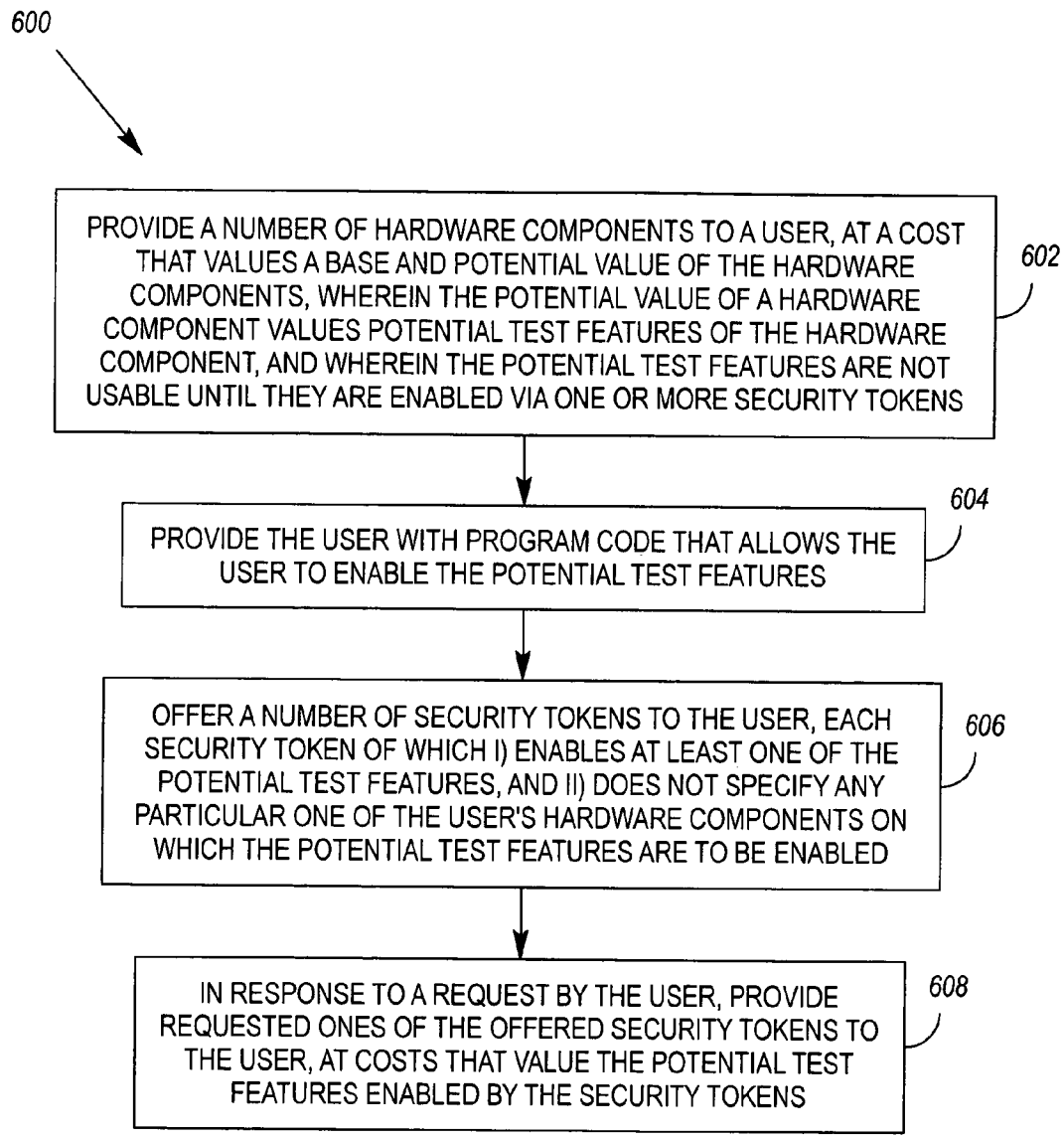
FIG. 6 illustrates a method 600 for providing ATE such as that which is disclosed in any of FIGS. 1-3 to a user.

FIG. 6 illustrates a method 600 for providing ATE such as that which is disclosed in FIGS. 1-3 to a user. The method 600 comprises providing 602 a number of hardware components to the user, at a cost that values a base and potential value of the hardware components. For example, an equipment manufacturer might supply the automated tester shown in FIG. 1 to a user. Note that the automated tester shown in FIG. 1 is loaded with a plurality of channel cards. Included in the base value of each component (e.g., the automated tester and each channel card) may be some or all of the value of the materials that are used to manufacture the component. The base value of each component may also include some or all of the value of any labor that was used to assemble the component. A component's base value may further comprise some amount of profit that the equipment manufacturer deems appropriate. Further, and assuming that a component comes enabled to provide at least some functionality, a component's base value may value this pre-enabled functionality.

In contrast to the base value of a component, the potential value of a component assigns a value to the potential test features that the component is capable of providing. Potential test features are not usable, however, until they are enabled via one or more security tokens.

Referring back to the method 600, the user is also provided 604 with program code that allows the user to enable the potential test features. In one embodiment of the method, the program code is preloaded onto the hardware components that the user initially purchases. In another embodiment, the program code is provided on a compact disc or other form of computer-readable media. In this latter embodiment, the media may be provided to the user along with the user's initial ATE purchase, or the media may be ordered as an upgrade option.

The method 600 then continues with the offering 606 of a number of security tokens to the user. As discussed previously, each security token 1) enables at least one potential test feature, but 2) does not specify any particular one of the user's hardware components on which the potential test feature is to be enabled. In one embodiment of the method, security tokens are offered to a user over the internet. By way of example, offered security tokens may enable one feature on one component, one feature on a plurality of components, or even a plurality of features. Security tokens may also be provided with limitations, such as use periods or expiration dates.

In response to a request by the user, requested ones of the offered security tokens are provided 608 to the user, at costs that value the potential test features enabled by the security tokens. In one embodiment, the security tokens are provided to the user as encrypted ASCII text strings. Such tokens are easily transferred to the user via the internet.

Optionally, the program code that a user receives as part of the method 600 provides a mechanism to enable at least a portion of ATE's potential test features in the absence of the security tokens that are required to do so. If the program code provides this mechanism, the method 600 may further comprise 1) periodically polling the program code for an itemization of the potential test features that have been enabled in the absence of required security tokens, and 2) charging the user for the potential test features that were enabled in the absence of required security tokens.

One advantage of the method 600 is that a user may upgrade the functionality of their ATE in a matter of minutes.

Consider now an exemplary application of the above methods and apparatus. FIG. 7 illustrates part of an exemplary price list 700 for ordering ATE. Note that the price list 700 comprises hardware items, as well as security token items 704, 706 (with the security tokens being represented in terms of the features they enable). In the price list 700 shown, each security token 704, 706 is presumed to enable only one instance of the specified feature. If a user wants to enable a feature on multiple devices, the user must order duplicate security tokens; or, for example, a user may choose to order two security tokens for enabling a feature permanently, and two security tokens for enabling the same feature for three months. In this manner, a user can 1) permanently enable those features of an ATE system that they expect to use indefinitely, and 2) temporarily enable those features that the user might only need to fulfill a current job order. The user may also choose to order two extra channel cards 702 as "spares". Given that channel cards are now available with very few features enabled, their "base+potential value" has fallen, and it makes sense for the user to order a couple extras as spares, in case one breaks, or in case the user's business expands and a couple of extras are needed.

After a user has selected the ATE components (hardware components 702 and security tokens 704, 706) that they would like to purchase, the user's order (Order_A) may be sent to a fulfillment center. However, unlike past ATE fulfillment centers that have needed to build a custom ATE system after receiving an order, the ATE fulfillment center receiving Order_A need only pull or assemble a handful of hardware components, as it now only needs to stock fully-loaded hardware components. Typically, the actual material, labor and stocking costs for fully-loaded hardware components are only slightly greater than the material, labor and stocking costs for hardware components having a plurality of different configurations.

Although the security tokens 704, 706 associated with Order_A may be preloaded onto the user's ATE system, the security tokens may also be mailed or emailed to the user shortly after Order_A is submitted. The security tokens 704, 706 may be sent to the user as an encrypted ASCII text file. When decrypted, the user can view and verify the contents of the file, which may appear as shown in FIG. 8.

Assume now that the user placing Order_A has access to a plurality of automated testers, as shown in FIG. 3. Upon receiving the security tokens 704, 706 associated with Order_A, the user chooses to feed these tokens to a security server 306 that interfaces with all of the user's automated testers 300-304 (which server will also interface with a new automated tester in Order_A when it arrives). Once the security tokens 704, 706 are fed to the security server 306, the user may immediately distribute them to one or more of his or her testers, thereby enabling the user to handle a job that was just received. When the user's new tester arrives, he or she can reassign the security tokens to the new tester, as originally intended. As the use requirements for each of the user's testers changes, the user can reassign the security tokens again and again, which is easier than having to physically redistribute channel cards or other components.

Figure 9:
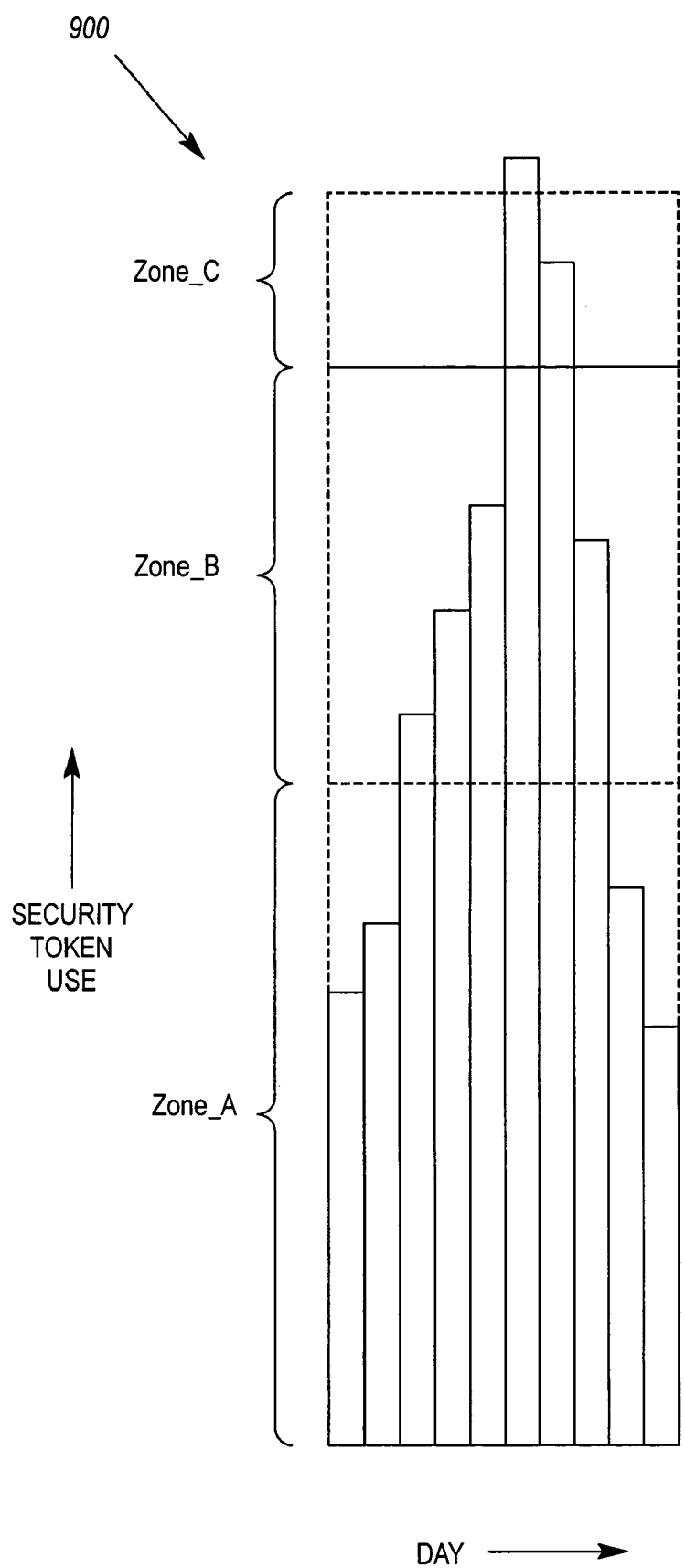
FIG. 9 illustrates the operation of a security token overuse policy.

FIG. 9 illustrates the operation of the user's overuse policy. During some time intervals (e.g., daily), the user operates in Zone_A, in which the user has purchased enough security tokens to enable all test features that are in use. During some time intervals, however, the user operates in Zone_B, in which the user has enabled test features for which he has yet to purchase security tokens. At yet other time intervals, the user attempts to operate in Zone_C, but is prohibited from doing so because it would require even more security tokens than his overuse policy permits. Periodically (e.g., once a month), the user's ATE is polled to determine the extent to which the user relied on his overuse policy. The user is then invoiced for any invocations of his overuse policy. The user may also be prompted to purchase additional security tokens.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. Automated test equipment, comprising:
 a plurality of hardware components, at least two of which provide a common test feature; and
 program code to:
  i) access a number of security tokens, each token of which grants rights to use one or more test features, without specifying a particular hardware component on which the test features are to be enabled; and
  ii) if a plurality of security tokens granting rights to use the common test feature are available, enable the common test feature on plural user-selected ones of the hardware components that provide the common test feature, as permitted by the plurality of security tokens.

2. The automated test equipment of claim 1, further comprising a plurality of automated testers amongst which said plurality of hardware components are distributed.

3. The automated test equipment of claim 2, further comprising a security token server for maintaining said number of security tokens.

4. The automated test equipment of claim 1, wherein the program code checks out any security token that is relied on to enable a test feature, thereby changing the status of the relied on security token to unavailable.

5. The automated test equipment of claim 4, wherein said number of security tokens comprise floating security tokens, and wherein said program code provides a mechanism to:
 check in a security token; and
 disable a test feature that was previously enabled by the checked in security token; and
 returning the status of the checked in security token to available.

6. The automated test equipment of claim 1, wherein the hardware components comprise channel cards, each channel card comprising a plurality of I/O pins for interfacing with a device under test.

7. The automated test equipment of claim 6, wherein at least one of said security tokens grants rights to use one or more test features on a particular channel card of an automated tester, without specifying a particular channel card on which the test features are to be enabled.

8. The automated test equipment of claim 1, wherein at least one of said security tokens grants rights to use one or more test features on a number of I/O pins for testing a device under test, without specifying on which or how many hardware components the pins can reside.

9. The automated test equipment of claim 1, wherein said common test feature is a scalable test feature.

10. The automated test equipment of claim 1, wherein said common test feature is selected from the group consisting of:
 test speed, storage for test vectors, storage for test waveforms, and storage for test drive edges.

11. A method for providing automated test equipment to a user, comprising:
 providing a number of hardware components to the user, at a cost that values a base and potential value of the hardware components, wherein the potential value of a hardware component values potential test features of the hardware component, and wherein the potential test features are not usable until they are enabled via one or more security tokens;
 providing to said user program code that allows the user to enable said potential test features;
 offering a plurality of security tokens to the user, each security token of which i) enables at least one of said potential test features, but ii) does not specify any particular one of the user's hardware components on which the potential test features are to be enabled; and
 in response to a request by the user, providing requested ones of said offered security tokens to the user, at costs that value the potential test features enabled by the security tokens.

12. The method of claim 11, wherein ones of said security tokens are provided to the user with associated use periods.

13. The method of claim 11, wherein ones of said security tokens are provided to the user with associated expiration dates.

14. The method of claim 11, wherein said program code provides a mechanism to enable a portion of said potential test features in the absence of the security tokens that are required to do so; said method further comprising:

periodically polling said program code for an itemization of said potential test features that have been enabled in the absence of required security tokens; and charging the user for the potential test features that were enabled in the absence of required security tokens.

15. The method of claim 11, wherein said security tokens are provided to the user as encrypted ASCII text strings.

16. The method of claim 11, wherein said security tokens are provided to the user over the internet.

17. A computer-based method for operating automated test equipment, comprising:

loading a test program for a device under test;

determining what features of the automated test equipment (ATE) are necessary to execute the test program;

determining the availability of security tokens needed to enable the features of the ATE that are necessary to execute the test program;

if there are not enough available security tokens to execute the test program, prompting a user with options for obtaining the required security tokens; and ensuring that the security tokens needed to execute the test program are checked out to the ATE that will execute the test program.

18. The computer-based method of claim 17, wherein said features that are determined comprise test speed and storage for test vectors.

19. The computer-based method of claim 17, wherein said options for obtaining the required security tokens comprise causing automated test equipment that will not execute the test program to relinquish at least one security token that it has checked out.

20. The computer-based method of claim 17, wherein said options for obtaining the required security tokens comprise purchasing the required security tokens.

21. The computer-based method of claim 17, wherein said options for obtaining the required security tokens comprise triggering an overuse policy.

22. The computer-based method of claim 17, further comprising releasing said required security tokens after said test program has been executed.

* * * * *